United States Patent [19]
Bales et al.

[11] Patent Number: 5,394,003
[45] Date of Patent: Feb. 28, 1995

[54] ACOUSTIC CHARGE TRANSPORT DEVICE BUFFERED ARCHITECTURE

[75] Inventors: James E. Bales, Urbana; Michael J. Hoskins, Mahomet, both of Ill.

[73] Assignee: Electronic Decisions Inc., Urbana, Ill.

[21] Appl. No.: 64,253

[22] Filed: May 20, 1993

[51] Int. Cl.$^6$ .............................. H01L 29/78
[52] U.S. Cl. ................. 257/416; 257/222; 257/249; 333/165
[58] Field of Search .......... 257/416, 222, 249; 333/165

[56] References Cited

U.S. PATENT DOCUMENTS

| | | | |
|---|---|---|---|
| 3,599,018 | 8/1971 | Osaka et al. | 307/577 |
| 4,633,285 | 12/1986 | Hunsinger et al. | 257/416 |
| 4,661,788 | 4/1987 | Levine | 333/165 |
| 4,993,053 | 2/1991 | Itoh et al. | 377/60 |
| 5,051,709 | 9/1991 | Birkett et al. | 333/28 R |
| 5,182,623 | 1/1993 | Hynecek | 257/230 |

FOREIGN PATENT DOCUMENTS

| | | |
|---|---|---|
| 2721812 | 11/1978 | Germany . |
| 53-142846 | 12/1978 | Japan .................. 333/165 |
| 1442841 | 7/1976 | United Kingdom . |

*Primary Examiner*—Sara W. Crane
*Attorney, Agent, or Firm*—Shlesinger Arkwright & Garvey

[57] ABSTRACT

An acoustic charge transport device comprises a substrate with a layer disposed thereon; a channel disposed within the layer for providing a propagation path for a surface acoustic wave; a contact operably connected and disposed at one end of the channel for injecting an electronic signal into the channel; a transducer disposed at the one end of the channel for generating and propagating the surface acoustic wave through the channel; a plurality of sensing electrodes operably associated with the channel and disposed along the propagation path of the surface acoustic wave for non-destructively sensing the electronic signal; and a plurality of active buffer circuits each having an input operably connected to respective sensing electrode and an output operably connected to an output circuit.

23 Claims, 8 Drawing Sheets

ACOUSTIC CHARGE TRANSPORT DEVICE BUFFERED ARCHITECTURE

This invention was made with Government support under contract number F30602-85-C-0170 awarded by the Department of Defense. The Government has certain rights in this invention.

FIELD OF THE INVENTION

The present invention relates generally to an acoustic charge transport device and particularly to an acoustic charge transport device with integrated active tap buffer circuits and the resulting architecture for realization of integrated analog signal processing systems.

BACKGROUND OF THE INVENTION

The acoustic charge transport (ACT) device is an integrated, high speed, GaAs charge transfer device in which electron packets are transported in the traveling wave potential wells of a single frequency surface acoustic wave (SAW) generated in the GaAs. The ACT device has been disclosed previously in U.S. Pat. No. 4,633,285 and other published documents.

Transversal filters have been implemented using charge coupled devices (CCD), acoustic charge transport (ACT) devices, and other charge transfer devices. These implementations have employed direct connections between the charge detection electrode and summing or signal modification circuits.

Prior art ACT integrated circuits incorporate passive charge detection and summing preceding any active circuits.

An important feature of the ACT device is non-destructive detection of the propagating charge signal. This feature makes the device useful as a delay line and transversal filter, and for other signal processing. The sensitivity of the charge detection process usually establishes the dynamic range of the signal processing system. The ACT programmable transversal filter (PTF) disclosed previously in copending U.S. patent application Ser. No. 07/707,147 employs divider networks connected between the non-destructive charge sensing electrodes and common signal summing nodes. These divider networks and their associated interconnect wiring decrease the impedance of the sensing electrodes which reduces charge detection sensitivity. Another limitation of the previously disclosed ACT PTF is the tap weight dependent impedance of the weighting circuit as seen by the common summing node. This results in the effect that programming of a single tap affects all other tap weights. The present invention provides a means for the realization of ACT programmable transversal filters with high dynamic range and nearly ideal programmable tap weight characteristics.

Multiple transversal filters in parallel, or filter banks, are useful signal processing devices that can be implemented with ACT devices. Prior art ACT device filter banks have employed a separate charge transport channel for each filter, resulting in performance limitations due to interchannel non-uniformities and very high power requirements due to the requirement for SAW power in each active charge transport channel. An embodiment of the present invention overcomes these limitations by realizing a filter bank with a single charge transport channel.

Prior art selectable delay lines, such as disclosed in U.S. Pat. No. 5,144,262, have employed a direct connection from the non-destructive sense tap to the tap selection switch, resulting in moderate to poor charge detection sensitivity due to parasitic capacitance of the parallel switches. The present invention provides improved charge detection sensitivity in selectable delay lines.

OBJECTS AND SUMMARY OF THE INVENTION

It is an object of the present invention to provide significant improvement in dynamic range, operational characteristics, and integrated functionality of ACT delay lines, transversal filters, and other ACT signal processing devices.

The present invention provides an architecture for the realization of analog signal processing devices which is enabled by electronic circuits compatible with ACT device integrated circuit fabrication processes. The circuits serve as buffers by providing high input impedance for high sensitivity non-destructive charge detection and low output impedance to drive subsequent signal processing circuits.

Integration of active buffer circuits with the ACT device is beneficial because it provides significantly improved charge detection sensitivity. An additional benefit of active buffer circuits is low source impedance to drive subsequent signal processing circuits such as programmable attenuators required for implementation of a programmable transversal filter. Thus, the active circuit serves as a buffer between the high impedance non-destructive sense (NDS) electrode and the subsequent circuits and interconnect wiring that would otherwise degrade charge detection sensitivity. Since the effects of parasitic capacitance due to interconnect wiring are greatly reduced with the tap buffer circuit, higher levels of integration and functionality can be achieved. Due to increased charge detection sensitivity afforded by the active buffer circuits, it is possible to reduce the active channel width of the ACT device while maintaining high dynamic range. This results in a reduction in the amount of SAW power required for ACT device operation. In many cases, the SAW power reduction is much greater than the power requirements of the active buffer circuits resulting in an overall reduction in the power requirement of the signal processing system.

An active buffer circuit for each NDS tap of a PTF is realized through integration of process compatible devices that can be configured and operated in a way that provides high input impedance and low output impedance. A preferred embodiment of the active buffer circuit is a GaAs metal-semiconductor field effect transistor (MESFET) in a source follower circuit configuration with a GaAs MESFET configured as an active load that provides the bias current for the source follower. The active buffer circuit input is connected to each non-destructive sense electrode of the ACT device and the buffer circuit outputs are available to provide a multi-tapped signal delay line.

The ACT buffered tap architecture multi-tapped signal delay line can be integrated with additional signal processing circuits, resulting in powerful signal processing devices. A transversal filter can be realized by connecting divider networks between each tap buffer output and a common summing node. The transversal filter response is established by the characteristics of the divider networks. A programmable transversal filter is realized by connecting a programmable divider network between each buffer output and a common summing node. A filter bank is realized by connecting a plurality of divider networks between each tap buffer output and a plurality of common summing nodes. A selectable signal delay line can be implemented using the ACT buffered tap architecture by connecting programmable switches between each tap buffer output and a common delay line output node. In general, the buffered tap architecture can be exploited to realize signal processing systems in which each tap buffer is connected to a plurality of signal modification circuits that are connected to a plurality of common summing nodes that serve as outputs of the device. These powerful signal processing systems can be successfully implemented because, unlike previously disclosed ACT signal processors, the charge detection process is buffered from the signal modification circuits.

An alternative embodiment of the acoustic charge transport device tap buffer circuit that provides much higher charge detection sensitivity is also disclosed. This alternative embodiment employs positive feedback between non-destructive charge sensing electrodes and physically adjacent electrodes to increase charge detection sensitivity. This alternative embodiment of the tap buffer circuit is easily incorporated into the buffered tap architecture to realize transversal filters, selectable delay lines, and other acoustic charge transport device signal processing systems.

In summary, the present invention provides the use of integrated active tap buffer circuits at each non-destructive charge sensing site on the device.

These and other objects of the present invention will become apparent from the following detailed description.

BRIEF DESCRIPTIONS OF THE DRAWINGS

DETAILED DESCRIPTION OF THE INVENTION

Figure 1:
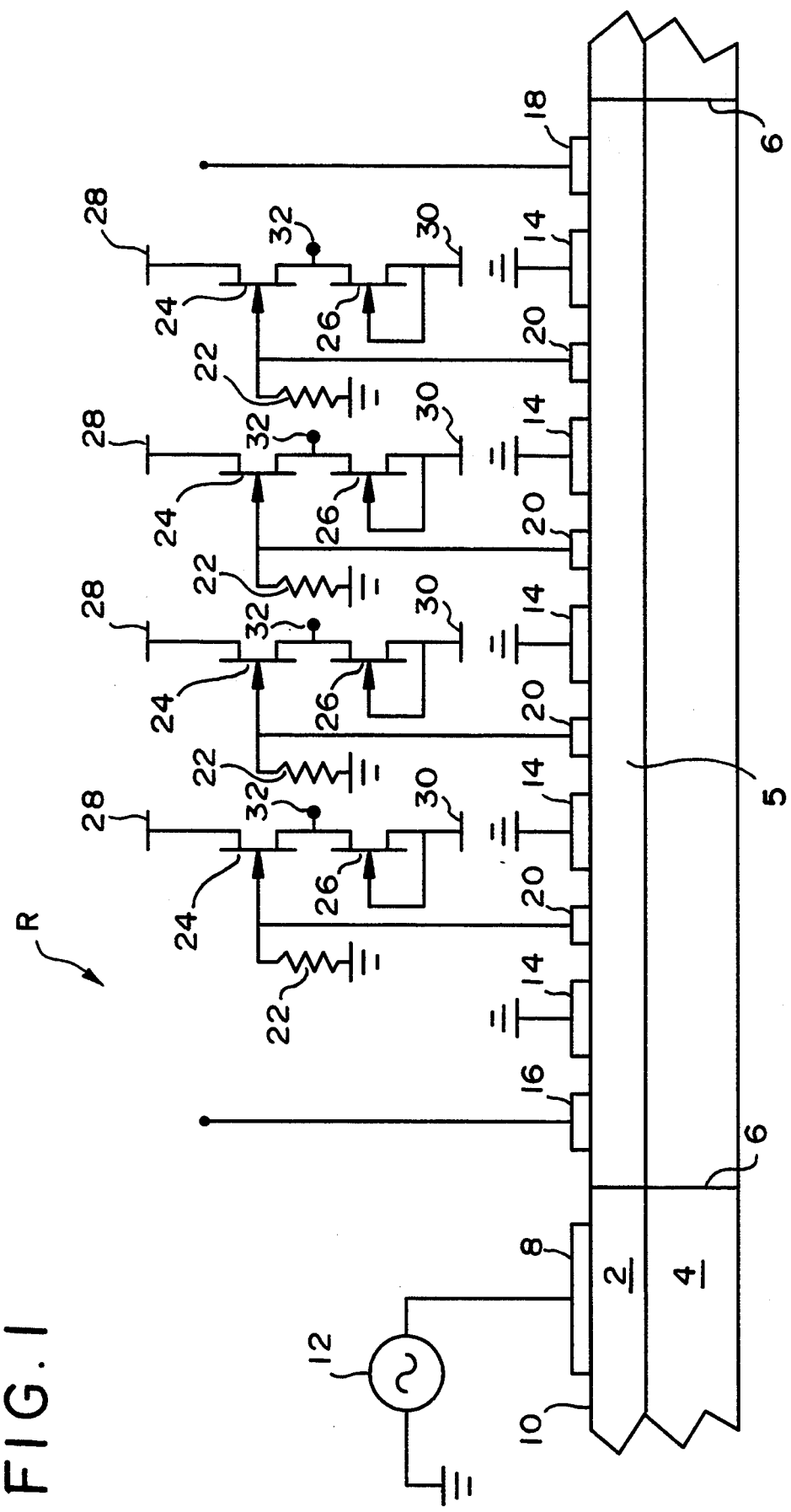
FIG. 1 is a fragmentary cross-sectional view of an acoustic charge transport device coupled to an active tap buffer circuit according to the invention.

Acoustic charge transport device R with integrated active tap buffer circuit, as shown in FIG. 1, comprises an active piezoelectric semiconductor layer 2 mounted on substrate 4. The layer 2 is, preferably, comprised of gallium arsenide. The ACT channel 5 is typically defined and isolated by proton bombardment of the region of the layer 2 not enclosed by the channel boundary 6. Transducer 8 is disposed on surface 10 of layer 2. Source 12 provides an energizing signal to the piezoelectric transducer 8, in order to cause generation of a high frequency surface acoustic wave which propagates through layer 2. A plurality of metal plates 14 forming Schottky barriers with respect to layer 2 are uniformly positioned on surface 10 of layer 2. An input ohmic contact or like structure 16 is interposed between transducer 8 and the first of Schottky barrier plates 14, and is adapted for injecting charge representative of a signal into the underlying transport channel so that the charge is transported by the wave generated by transducer 8. An output ohmic contact or like structure 18 is provided at the opposite end of layer 2 for extracting charge from the layer 2 after it has been transported therethrough by the surface acoustic wave. Depletion of the channel electrons under the Schottky barriers 14 causes a transport channel to be defined in the layer 2, and the surface acoustic wave generated by the transducer 8 causes charge injected through input contact 16 to be transported through the channel to output contact 18.

A plurality of metallic non-destructive sense electrodes or taps 20 are disposed along surface 10. These non-destructive electrodes also form Schottky barrier junctions with respect to layer 2. Each of the non-destructive sense electrodes 20 is, preferably, disposed between two adjacent plates 14. The electrodes 20 are non-destructive because they do not interfere with or otherwise inhibit transport of the charge packets. The non-destructive sense electrodes. 20 are connected to ground potential through high valued resistors 22. This is necessary to maintain a continuous DC potential on the surface 10 of layer 2. A discontinuity in the DC potential on surface 10 of layer 2 can interfere with the charge transport process.

Charge injected into the transport channel through input contact 16 is transported through the channel with the surface acoustic wave generated by transducer 8. The charge is transported in positive half cycles of the wave, and the charges are bunched by the wave in discrete identifiable packets. Movement of the charge packets through the channel causes an image charge to be impressed upon each of the non-destructive sense electrodes 20 as the packets pass below. The image charges move with the associated charge packets, with the result that the non-destructive sense electrodes 20 sense the charge quantities of the packets as they move along the channel, and therefore permit this quantity to be determined.

The image charge on the non-destructive sense electrode 20 induces a voltage signal that is proportional to the ratio of the image charge to the ground referenced capacitance of the node 20. The voltage signal is applied to the active amplifier circuit comprising FET 24 and FET 26. FET 24 is operated as a source follower and FET 26 operates as a current source that provides the DC bias current for FET 24. DC current is supplied by voltage sources connected to the drain terminal 28 of FET 24 and the source terminal 30 of FET 26. In a preferred embodiment, the FETs are Schottky barrier gate FETs implemented in GaAs using the ACT integrated circuit (ACTIC) process as disclosed in copending patent applications Ser. Nos. 07/676,965 and 07/676,967. The applied signal voltage is amplified with a voltage gain of nearly unity and transferred to the amplifier output terminal 32.

The relationship between the image charge and the induced voltage on non-destructive sense electrodes 20 is the charge detection sensitivity, which depends on the effective capacitance from the non-destructive sense electrode 20 to ground. The capacitance between the non-destructive sense electrodes 20 and the Schottky barrier plates 14 contribute to the total capacitance. The other significant contribution to the total capacitance is the circuit connected to the non-destructive sense electrode 20 and the interconnect wiring between the non-destructive sense electrode 20 and active amplifier circuit. The amplifier circuit of the present invention, comprising FET 24 and FET 26 is designed to have very small input capacitance and is integrated physically close to the non-destructive sense electrode 20 to minimize capacitance due to interconnect wiring. Thus, the total capacitance from the non-destructive sense electrode 20 to ground is dominated by capacitance between non-destructive sense electrode 20 and adjacent Schottky barrier plates 14. This results in high charge detection sensitivity.

The active tap buffer circuit, comprising FET 24 and FET 26, is designed such that it can drive a low impedance without significantly affecting the output voltage level. This is beneficial because many signal processing functions are implemented with circuits that do not provide a very high impedance. Furthermore, the circuits which follow the buffer amplifier can be physically located some distance from the tap buffer circuit because the interconnect wiring capacitance does not significantly affect the signal voltage. This permits a high density of circuits and high levels of functionality to be integrated with the ACT device without significantly sacrificing signal processing dynamic range.

Those skilled in the art will recognize that a FET configured to operate as a source follower is just one of many possible active tap buffer circuits. The Schottky barrier gate FET in GaAs, typically referred to as a metal-semiconductor FET (MESFET), is a preferred device for implementing tap buffer circuits because it provides very high input impedance and can be easily integrated on the same substrate as the acoustic charge transport device. The source follower circuit configuration is preferred because it provides low gain sensitivity to device parameter variations, very high input impedance, and low output impedance. The source follower circuit can be implemented with a single transistor and an additional transistor or other device to provide the required DC bias current.

Figure 2:
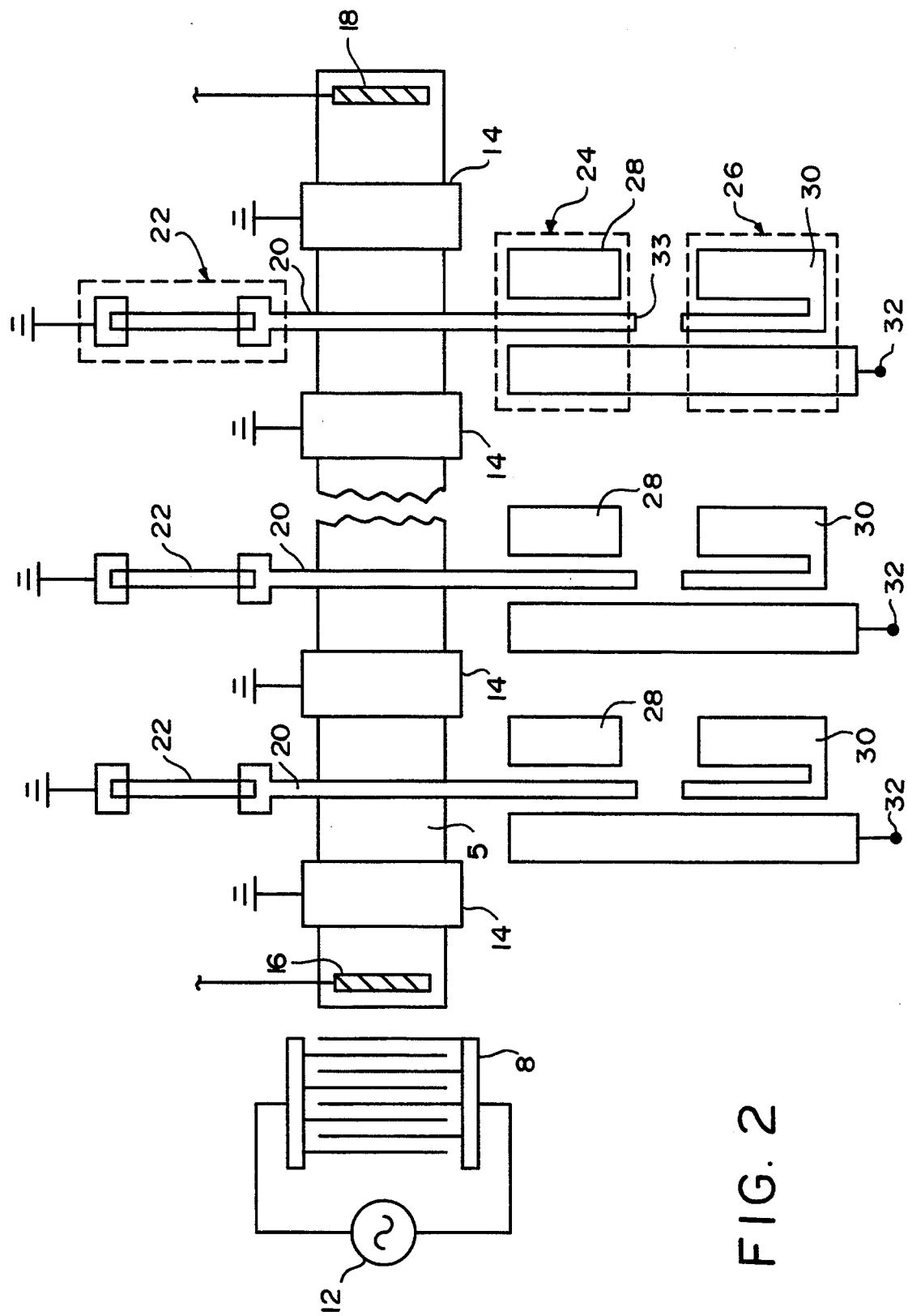
FIG. 2 is a fragmentary plan view of the acoustic charge transport device with integrated active tap buffer circuits of FIG. 1.

A plan view of the acoustic charge transport device R with integrated active tap buffer circuit is shown in FIG. 2. The non-destructive charge sensing electrode, or tap 20 is connected to the metal Schottky barrier gate 33 of source follower MESFET 24. In a preferred configuration, which reduces interconnect parasitic capacitance, the tap 20 and MESFET gate 33 are implemented with a continuous metal structure. To reduce the length of the interconnect, the source follower MESFETs 24 are placed on the same pitch as the taps 20. The integrated resistor 22, typically a semiconductor layer or thin film conductor, is connected to each tap 20 and provides a DC bias voltage for the tap 20 and source follower MESFET 24. The source follower MESFET 24 is connected to active load MESFET 26 and the signal output 32 is available for connection to subsequent signal processing circuits.

The acoustic charge transport device R with active tap buffer circuit establishes a unique architecture for the realization of high performance acoustic charge transport analog signal processing devices.

Figure 3:
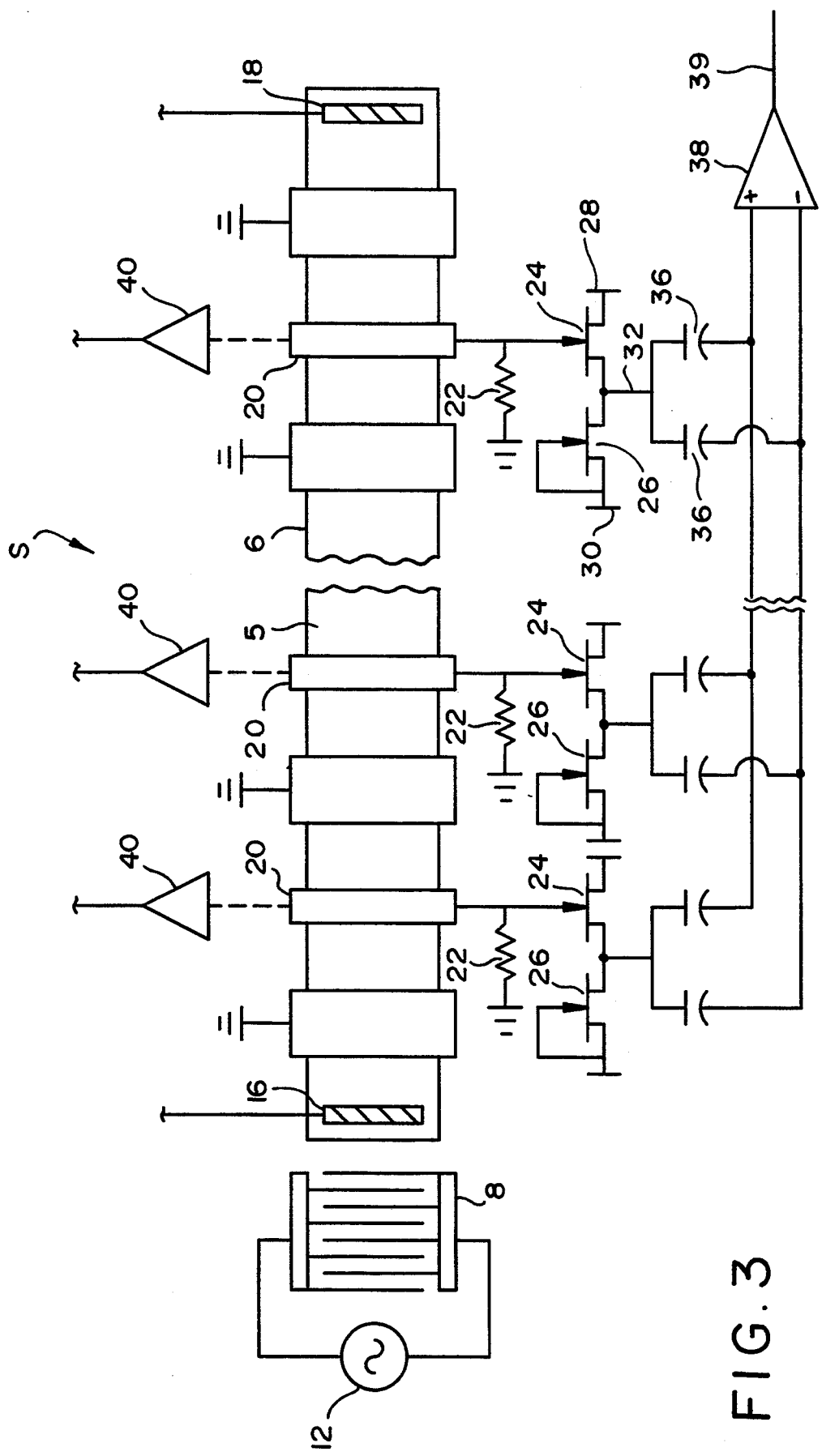
FIG. 3 is a schematic plan view of an embodiment of a transversal filter according to the invention.

FIG. 3 discloses an acoustic charge transport transversal filter device S that exploits the buffered tap architecture. A high level RF signal 12 is applied to transducer 8, in order to cause a surface acoustic wave to be generated at the excitation frequency for illuminating the active charge transport channel 5 of the device defined by proton isolation boundary 6. The information signal waveform is impressed on a DC bias voltage level and is applied to input contact 16 so that charge packets may be formed and transported within the transport channel 5 by the propagating surface acoustic wave. The amount of charge in each packet is proportional to the amplitude of the signal waveform at the particular instant in time when the packet is separated from the neutral region at the input contact 16. The packets propagate along the channel 5 at the surface acoustic wave velocity, and are individually sensed by the non-destructive sense electrodes 20 deposited on the piezoelectric semiconductor surface. At the far end of the channel 5, the charge packets are extracted through the output contact 18. Each tap 20 is connected to the input of an active tap buffer circuit comprising source follower MESFET 24 and active load MESFET 26. FET 24 is operated as a source follower and FET 26 operates as a current source that provides the DC bias current for FET 24. DC current is supplied by voltage sources connected to the drain terminal 28 of FET 24 and the source terminal 30 of FET 26. The source follower MESFET 24 provides a high input impedance which results in high charge detection sensitivity. The signal voltage developed on the non-destructive sense electrode 20 is transferred to the output node 32 of the source follower 24 with nearly unity voltage gain. The source follower output provides a low impedance for driving the tap weight circuits comprising capacitors 36. The tap weight circuits are connected to the input of differential amplifier 38. The capacitors 36 function as tap weight circuits because the applied signal is multiplied by the ratio of the capacitor 36 and the total effective capacitance to ground on the amplifier input node to which the capacitor is connected. The output signals of all tap weight circuits are summed at the amplifier 38 inputs to generate an output voltage at output terminal 39. The differential amplifier 38 provides functionality to realize negative polarity tap weights. Each tap 20 may also be connected to one or more additional tap buffer circuits 40. Since the tap buffer circuits 40 provide high input impedance to the tap 20, additional signal processing functionality can be integrated without sacrificing charge detection sensitivity.

Prior art acoustic charge transport device transversal filters have employed a direct connection from the non-destructive sense electrode to the tap weight circuits. This results in lower charge detection sensitivity compared to that realized with the active tap buffer circuit of the present invention.

Figure 4:
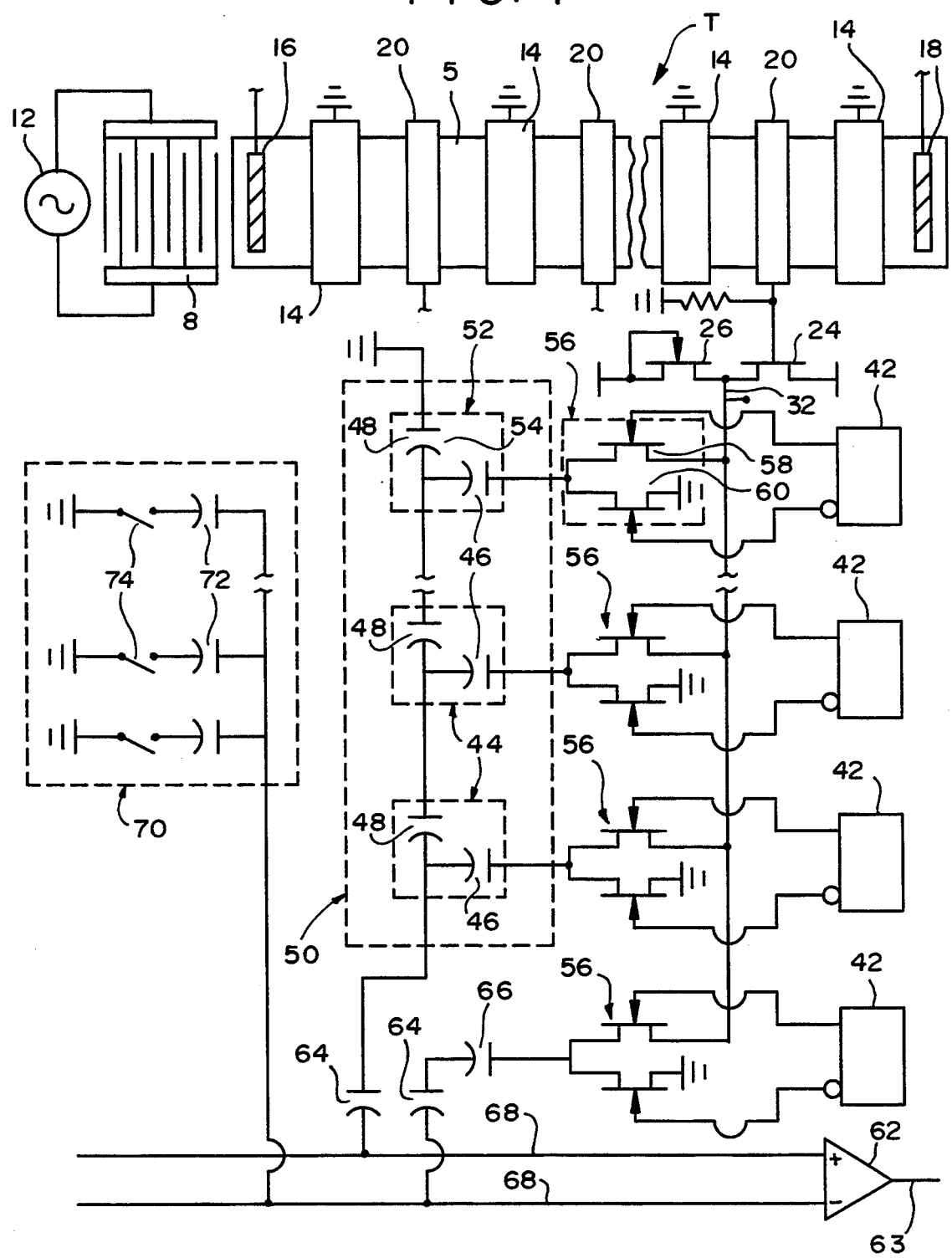
FIG. 4 is a schematic plan view of an embodiment of a programmable transversal filter according to the invention.

Another embodiment of the present invention is disclosed in FIG. 4, showing a programmable transversal filter T implemented with the acoustic charge transport device buffered tap architecture. Operation of the acoustic charge transport device T and active tap buffer circuits is substantially the same as previously described. The signal voltage developed on the non-destructive sense electrode 20 is transferred to the output node 32 of the source follower FET 24 with nearly unity voltage gain. Each source follower output is operably connected to a programmable tap weight circuit which implements a four quadrant multiplication of the delayed signal and the digital word stored in digital memory devices 42.

A divider section 44 comprises shunt branch 46 and series branch 48. The series branches 48 of each section 44 are connected to other sections, resulting in multi-section divider network 50. The series branches 48 of the divider network section 50 have capacitor values of $2C_o$, while the shunt branches 46 incorporate capacitors having a value of $C_o$. The last section 52 of the multi-section divider network 50 has a series branch capacitor 54 that is connected directly to the network ground reference and has a value of $C_o$. The voltage transfer function of the multi-section divider network 50 is proportional to $(1)/(2^{(n+1)})$, where n is the number of divider sections 44 between the section to which the input voltage is applied and the output of the multi-section network 50.

Operation of the MESFET switch pairs 56 is controlled by the complementary outputs of digital memory device 42. The memory device 42 stores a single bit of the digital tap weight word. A means for programming the digital memory device 42 is provided. An example of programming means is disclosed in copending patent application Ser. No. 07/707,147. When closed, switch 58 directs the signal voltage to a shunt branch 46 of the capacitor divider network 50. When switch 58 is open, switch 60 is closed and connects shunt branch 46 of network 50 to ground to maintain the accuracy of the capacitor divider network 50. The output voltage of the network is proportional to the sum of the input signal voltages that have been divided by $2^{(n+1)}$, depending on the number n of divider sections 44 between the input branch and the output. The signal at the output of divider network 50 is applied to the non-inverting input of differential amplifier 62 through capacitor 64. Capacitor 64 serves to establish a fixed tap weight that may be different for each tap of the transversal filter. A second network comprising capacitor 66 is coupled to the inverting input of differential amplifier 62 through fixed tap weight capacitor 64. The signal voltage applied to this network is also controlled by a MESFET switch pair 56 that is programmed by the complementary outputs of a digital memory device 42 that stores the most significant bit of the digital tap weight word. The signal voltages on the two inputs of differential amplifier 62 are subtracted and amplified, resulting in an output signal voltage at output 63 that is proportional to the product of the input signal voltage and the two's complement digital tap weight word. It should be apparent that the total output of the differential amplifier is proportional to the summation of the delayed signal from each tap multiplied by the respective digital tap weight words and further multiplied by the fixed tap weight value established by the value of capacitor 64.

An imbalance in the impedance on the summing nodes 68 connected to the input of differential amplifier 62 can result in tap weight inaccuracy. An optional tap weight trim circuit 70 may be incorporated to compensate for summing node impedance imbalance. Impedance imbalance is corrected by connecting capacitors 72 between summing node 68 and ground through switches 74. In a preferred configuration, the switches are controlled by programmable memory devices (not shown). The capacitance of capacitors 72 are usually chosen in binary weighted increments to provide maximum tap weight trim resolution.

The tap weight divider networks 50 have the property of providing a constant impedance to the summing nodes 68, regardless of the programmed tap weight. Thus, the tap weight proportionality factor that depends on the summing node impedance is a constant. This implies that changing a tap weight does not affect the amplitude of other tap weights. The input impedance of the tap weight divider network as seen by the tap buffer circuit is a function of programmed tap weight. However, the driving impedance of the tap buffer circuit, comprising source follower MESFET 24 and active load MESFET 26, is sufficiently low that the input voltage to the divider network is not significantly affected by the tap weight. Thus, the tap weight characteristics of the buffered tap architecture programmable transversal filter are nearly ideal. Prior art ACT PTFs have non-ideal tap weight characteristics because a single tap weight affects all other tap weights due to the tap weight dependent summing node impedance.

Figure 5:
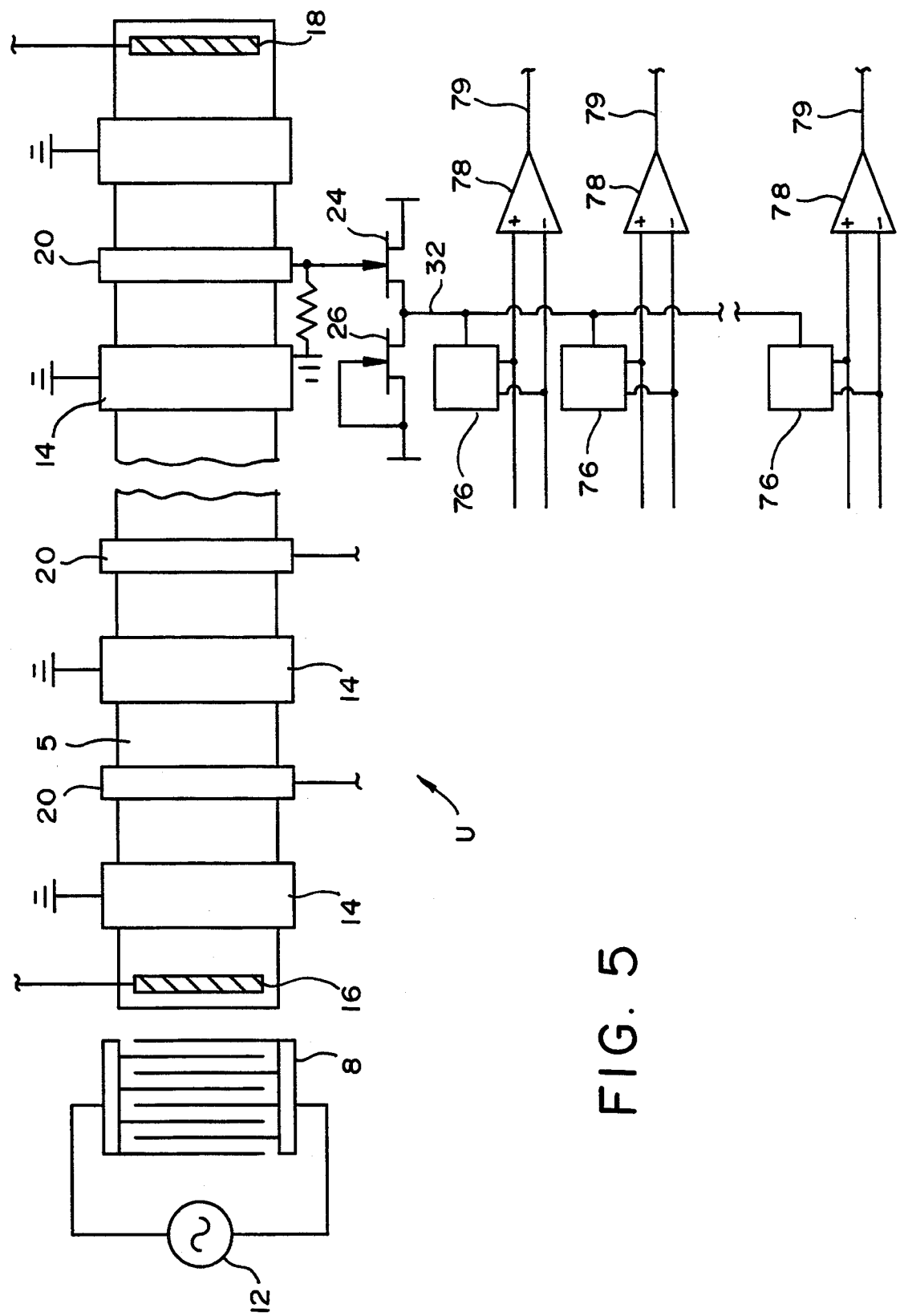
FIG. 5 is a schematic plan view of an embodiment of parallel transversal filters according to the invention.

FIG. 5 discloses a transversal filter bank U implemented with the acoustic charge transport device buffered tap architecture. Operation of the acoustic charge transport device and active tap buffer circuits is substantially the same as previously described. The signal voltage developed on the non-destructive sense electrode 20 is transferred to the output node 32 of the source follower FET 24 with nearly unity voltage gain. The source follower output provides a low impedance for driving a plurality of tap weight circuits 76. The output of each tap weight circuit 76 is connected to the inputs of a unique differential amplifier 78. Summation of the weighted signal voltages from different taps occurs at the input nodes of the amplifiers 78. The differential amplifier 78 provides the functionality for the realization of negative polarity tap weights. Usually, the tap weight circuits are designed such that a different response function is realized at the multiple outputs 79 of the filter bank. The tap weight circuits 76 may be fixed or programmable.

Prior art acoustic charge transport transversal filter banks have been implemented with a single active charge transport channel for each filter. The present invention is beneficial because it eliminates the multiple active channels which are a source of non-uniformity and because it greatly reduces the SAW power requirement.

Figure 6:
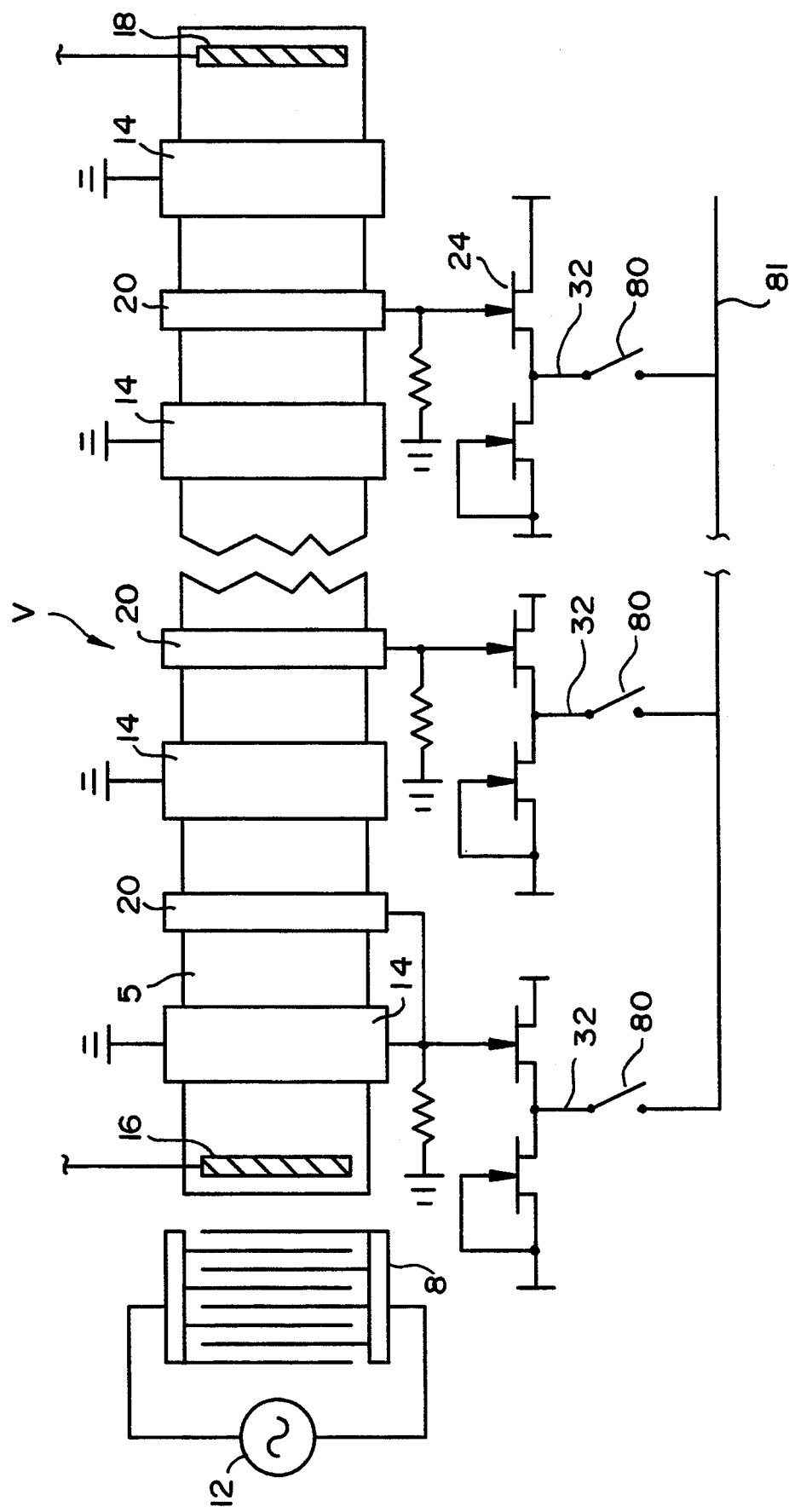
FIG. 6 is a schematic plan view of a programmable delay line according to the invention.

FIG. 6 discloses a selectable delay line V implemented with the acoustic charge transport device buffered tap architecture. Operation of the acoustic charge transport device and active tap buffer circuits is substantially the same as previously described. The signal voltage developed on the non-destructive sense electrode 20 is transferred to the output node 32 of the source follower 24 with nearly unity voltage gain. The source follower output is connected to a switch 80 which provides the means for connecting a tap 20 to the output 81. The switches 80 are operated such that one switch is closed while maintaining all others in the open state. The source follower output of the selected tap provides a low impedance for driving the parasitic impedance due to interconnect wiring and the switches connected to unselected taps.

Prior art acoustic charge transport device selectable delay lines have employed switches connected directly to the non-destructive sense electrode. The present invention is beneficial because it eliminates the charge sensitivity degradation caused by the parasitic capacitance of the plurality of switches connected to the output.

Figure 7:
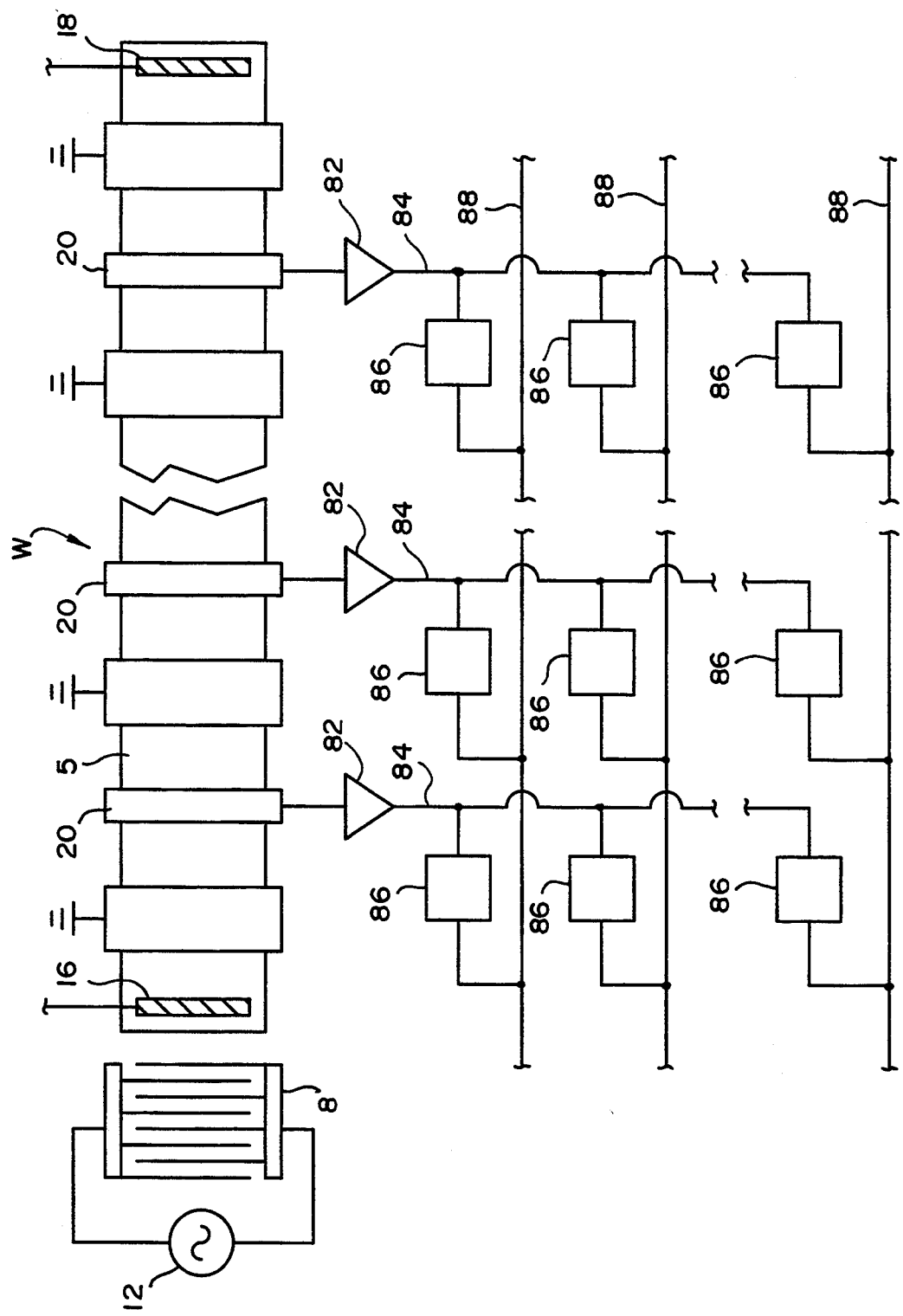
FIG. 7 is a schematic plan view of a signal processing system according to the invention.

FIG. 7 discloses a signal processing device W implemented with the acoustic charge transport device buffered tap architecture. Operation of the acoustic charge transport device is substantially the same as previously described. The active tap buffer circuit 82 provides a high impedance to the non-destructive charge sensing electrode 20, resulting in high charge detection sensitivity. The detected charge signal at the input of tap buffer 82 is transferred to the output 84 of the tap buffer. The tap buffer may provide signal voltage gain. The signal voltage at the output 84 of tap buffer 82 is applied to two or more signal processing circuits 86. The signal processing circuits 86 provide a signal transfer function such as amplitude and phase modification, switching, delay, integration, or differentiation. The transfer function may be fixed or programmable by analog or digital means. The output of each signal processing circuit 86 is operably connected to one of a plurality of common summing nodes 88, which serve as outputs of the device. The signal processing device provides a means for operating on a single input signal and providing multiple processed outputs.

Figure 8:
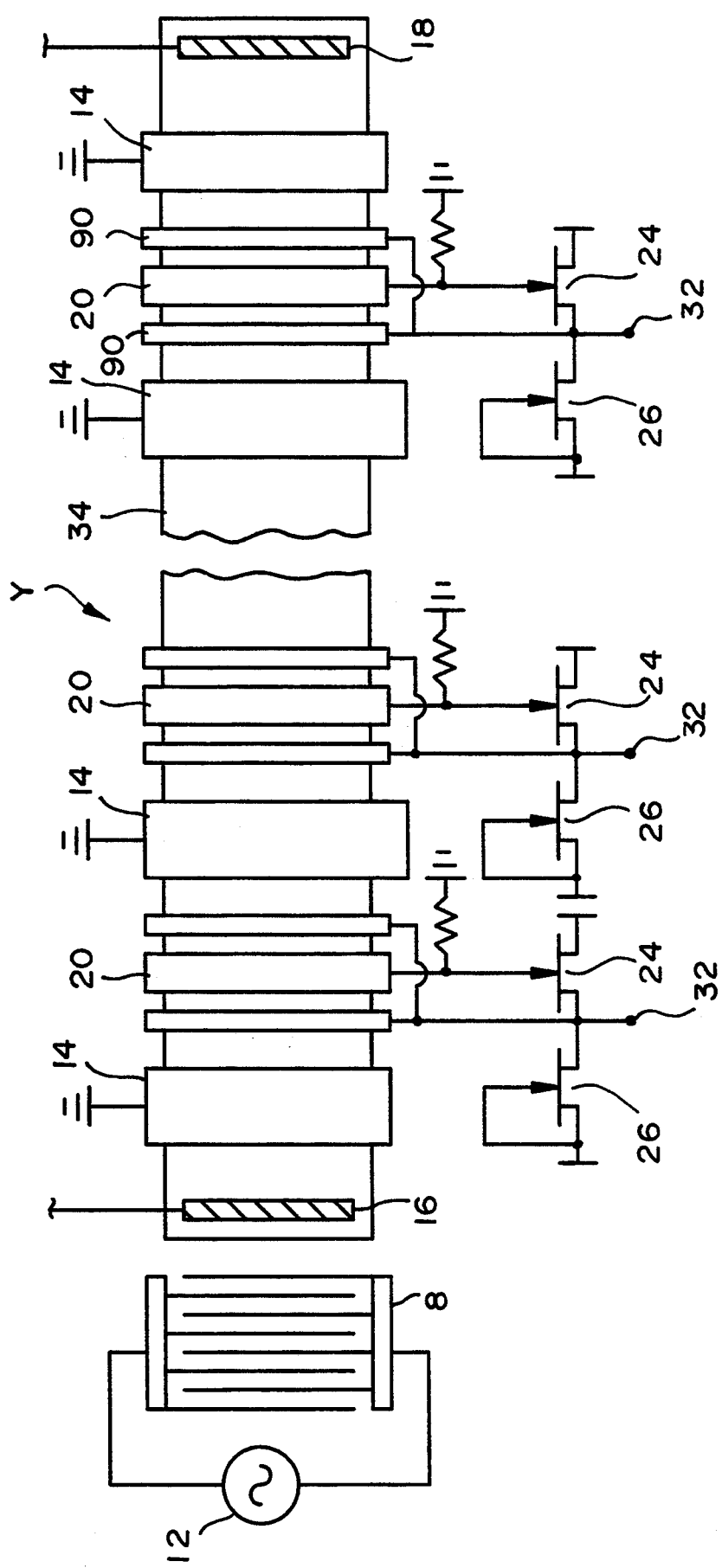
FIG. 8 is an alternative embodiment of an acoustic charge transport device with active tap buffer circuit according to the invention.

FIG. 8 discloses an alternative embodiment of the acoustic charge transport device Y with tap buffer circuit that provides much higher charge detection sensitivity. Operation of the acoustic charge transport device is substantially the same as previously described. The image charge on the non-destructive sense electrode 20 induces a voltage signal that is proportional to the image charge. The voltage signal is applied to the active amplifier circuit comprising MESFET 24 and MESFET 26. MESFET 24 is operated as a source follower and MESFET 26 operates as a current source that provides the bias current for MESFET 24. The applied signal voltage is amplified with a voltage gain of nearly unity and transferred to the amplifier output terminal 32. The output signal at terminal 32 is applied to guard electrodes 90.

The relationship between the image charge and induced voltage on non-destructive sense electrodes 20 is the charge detection sensitivity, which depends on the effective capacitance from the non-destructive sense electrode 20 to ground. The capacitance between the non-destructive sense electrodes 20 and the grounded Schottky barrier plates 14 contribute to the total capacitance. The other significant contribution to the total capacitance is the circuit connected to the non-destructive sense electrode 20 and the interconnect wiring between the non-destructive sense electrode and the circuit. The amplifier circuit of the present invention, comprising MESFET 24 and MESFET 26 is designed to have very small input capacitance and is integrated physically close to the non-destructive sense electrode 20 to minimize capacitance due to the interconnect wiring. The capacitance from the non-destructive sense electrode 20 to grounded Schottky barrier plates 14 is effectively reduced by the presence of guard electrodes 90. Although the capacitance between the non-destructive sense electrode 20 and the adjacent guard electrodes 90 is relatively high, the guard electrodes 90 are charged to nearly the same potential as the sense electrode 20 by the low output impedance of the source follower MESFET 24. Thus, the effective capacitance from the non-destructive sense electrode 20 to ground is significantly reduced by the positive feedback signal applied to the guard electrodes 90, resulting in significantly enhanced charge detection sensitivity. The guard electrodes 90 develop an image charge as the signal charge is transported below the electrode in the active channel 34, but the charge detection sensitivity of the guard electrodes 90 is low due to the low impedance of source follower MESFET 24. This is desirable because the charge detection by guard electrodes 90 can interfere with the desired charge detection of non-destructive sense electrode 20.

This alternative embodiment of the tap buffer circuit is easily incorporated into the buffered tap architecture to realize transversal filters, selectable delay lines, and other acoustic charge transport device signal processing systems.

Prior art acoustic charge transport device integrated circuits incorporate passive charge detection and signal processing circuits prior to the summing operation. The present invention provides several benefits. The primary benefit is increased charge detection sensitivity, providing improved signal processing dynamic range. In lieu of improved dynamic range, the SAW power requirement can be significantly reduced or some combination of dynamic range improvement and SAW power reduction can be achieved. Tap buffer circuits that provide positive feedback to electrodes adjacent to the sense electrodes provide further charge detection sensitivity improvement. Another benefit of the acoustic charge transport device buffered tap architecture is the low output impedance of the tap buffer circuits. This greatly reduces sensitivity to interconnect structures and input impedance of subsequent circuits, permitting a much higher level of integration and functionality.

The primary disadvantage of the acoustic charge transport device buffered tap architecture is power consumption of the active tap buffer circuits. This is largely offset by a significantly reduced SAW power requirement relative to that associated with the equivalent dynamic range acoustic charge transport device implemented without tap buffer circuits.

While this invention has been described as having preferred design, it is understood that it is capable of further modification, uses and/or adaptations following in general the principle of the invention and including such departures from the present disclosure as come within known or customary practice in the art to which the invention pertains, and as may be applied to the essential features set forth, and fall within the scope of the invention or the limits of the appended claims.

We claim:

1. An acoustic charge transport device, comprising:
   a) a substrate;
   b) a layer disposed on said substrate;
   c) a channel disposed within said layer for providing a propagation path for a surface acoustic wave, said channel having first and second ends;
   d) an input contact operably connected and disposed at said first end of said channel for injecting an electronic signal into said channel;
   e) an output contact operably connected and disposed at said second end of said channel for extracting the electronic signal after it has traversed through said channel;
   f) a transducer disposed at said first end for generating and propagating the surface acoustic wave through said channel from said first end to said second end for thereby transporting the electronic signal through said channel;

g) a plurality of sensing electrodes operably associated with said channel and disposed along the propagation path of the surface acoustic wave for non-destructively sensing the electronic signal;

h) a plurality of active buffer circuits each having an input operably connected to respective sensing electrode and an output operably connected to an output circuit.

i) a plurality of guard electrodes;

j) each of said sensing electrodes being associated with it a pair of said guard electrodes, each of which is disposed on each side of the respective sensing electrode in the propagation path of the surface acoustic wave; and k) said pair of guard electrodes being connected to the output of respective buffer circuit.

2. An acoustic charge transport device as in claim 1, wherein:

a) each of said buffer circuits is an amplifier circuit.

3. An acoustic charge transport device as in claim 2, wherein:

a) said amplifier circuit comprises a first FET operated as a source follower.

4. An acoustic charge transport device as in claim 3, wherein:

a) said amplifier circuit includes a second FET coupled to said first FET to provide a DC bias current to said first FET.

5. An acoustic charge transport device as in claim 4, wherein:

a) said first and second FET's are integrated in said layer.

6. An acoustic charge transport device as in claim 4, wherein:

a) said first and second FET's are implemented in GaAs.

7. An acoustic charge transport device as in claim 5, wherein:

a) each of said sensing electrodes and the corresponding gate of the respective first FET is a continuous metal.

8. An acoustic charge transport device, comprising:

a) a substrate;

b) a layer disposed on said substrate;

c) a channel disposed within said layer for providing a propagation path for a surface acoustic wave, said channel having first and second ends;

d) an input contact operably connected and disposed at said first end of said channel for injecting an electronic signal into said channel;

e) an output contact operably connected and disposed at said second end of said channel for extracting the electronic signal after it has traversed through said channel;

f) a transducer disposed at said first end for generating and propagating the surface acoustic wave through said channel from said first end to said second end for thereby transporting the electronic signal through said channel;

g) a plurality of sensing electrodes operably associated with said channel and disposed along the propagation path of the surface acoustic wave for non-destructively sensing the electronic signal;

h) a plurality of integrated active buffer circuits disposed on said layer, each having an input operably connected to respective sensing electrode and an output operably connected to an output circuit;

i) a plurality of guard electrodes;

j) each of said sensing electrodes has associated with it a pair of said guard electrodes, each of which is disposed on each side of the respective sensing electrode in the propagation path of the surface acoustic wave; and k) said pairs of guard electrodes are connected to the output of respective buffer circuit.

9. An acoustic charge transport device as in claim 8, wherein:

a) each of said buffer circuits is an amplifier circuit.

10. An acoustic charge transport device as in claim 9, wherein:

a) said amplifier circuit comprises a first FET operated as a source follower.

11. An acoustic charge transport device as in claim 10, wherein:

a) said amplifier circuit includes a second FET coupled to said first FET to provide a DC bias current to said first FET.

12. An acoustic charge transport device as in claim 11, wherein:

a) said first and second FET's are implemented in GaAs.

13. An acoustic charge transport device as in claim 10, wherein:

a) each of said sensing electrodes and the corresponding gate of the respective first FET is a continuous metal.

14. A signal processing circuit, comprising:

a) a substrate;

b) a layer disposed on said substrate;

c) a channel disposed within said layer for providing a propagation path for a surface acoustic wave, said channel having first and second ends;

d) an input contact operably connected and disposed at said first end of said channel for injecting an electronic signal into said channel;

e) an output contact operably connected and disposed at said second end of said channel for extracting the electronic signal after it has traversed through said channel;

f) a transducer disposed at said first end for generating and propagating the surface acoustic wave through said channel from said first end to said second end for thereby transporting the electronic signal through said channel;

g) a plurality of sensing electrodes operably associated with said channel and disposed along the propagation path of the surface acoustic wave for non-destructively sensing the electronic signal;

h) an output circuit for processing the sensed electronic signal from said sensing electrodes;

i) a plurality of active buffer circuits each having an input operably connected to respective sensing electrode and an output operably connected to said output circuit;

j) said output circuit comprising a differential amplifier having input and output;

k) a plurality of tap weight circuits each operably connected to respective buffer circuit and said differential amplifier input; and l) said tap weight circuits each including a pair of parallel capacitors.

15. A signal processing circuit as in claim 14, wherein:

a) said buffer circuits are integrated in said layer.

16. A signal processing circuit as in claim 15, wherein:

a) said buffer circuits are implemented in GaAs.

17. A signal processing circuit as in claim 14, wherein:
   a) said buffer circuits each comprises a first FET operated as a source follower.

18. A signal processing circuit as in claim 17, wherein:
   a) said buffer circuits each includes a second FET coupled to said first FET to provide a DC bias current to said first FET.

19. A signal processing circuit, comprising:
   a) a substrate;
   b) a layer disposed on said substrate;
   c) a channel disposed within said layer for providing a propagation path for a surface acoustic wave, said channel having first and second ends;
   d) an input contact operably connected and disposed at said first end of said channel for injecting an electronic signal into said channel;
   e) an output contact operably connected and disposed at said second end of said channel for extracting the electronic signal after it has traversed through said channel;
   f) a transducer disposed at said first end for generating and propagating the surface acoustic wave through said channel from said first end to said second end for thereby transporting the electronic signal through said channel;
   g) a plurality of sensing electrodes operably associated with said channel and disposed along the propagation path of the surface acoustic wave for non-destructively sensing the electronic signal;
   h) an output circuit for processing the sensed electronic signal from said sensing electrodes, said output circuit comprising a differential amplifier having input and output;
   i) a plurality of active buffer circuits each having an input operably connected to respective sensing electrode and an output operably connected to said output circuit, said buffer circuits each comprising a first FET operated as a source follower;
   j) a plurality of programmable tap weight circuits each operably connected to respective buffer circuit and said differential amplifier input;
   k) each of said programmable tap weight circuits including a divider network and another network connected to the non-inverting and inverting inputs, respectively, of said differential amplifier; and
   l) said divider network including series and shunt portions, each of said shunt portions being switchable to respective buffer circuit or ground, and said another network being switchable to respective buffer circuit or ground.

20. A signal processing circuit as in claim 19, wherein:
   a) said shunt branches each comprises a first capacitor;
   b) said series branches each comprises a second capacitor; and
   c) said second capacitor is twice the value of said first capacitor.

21. A signal processing circuit as in claim 19 and further comprising:
   a) a trim circuit connected to the inverting input of said differential amplifier; and
   b) said trim circuit including a plurality of capacitors independently switchable to said differential amplifier.

22. A signal processing circuit as in claim 19 wherein:
   a) said divider network has substantially constant output impedance.

23. A signal processing circuit, comprising:
   a) a substrate;
   b) a layer disposed on said substrate;
   c) a channel disposed within said layer for providing a propagation path for a surface acoustic wave, said channel having first and second ends;
   d) an input contact operably connected and disposed at said first end of said channel for injecting an electronic signal into said channel;
   e) an output contact operably connected and disposed at said second end of said channel for extracting the electronic signal after it has traversed through said channel;
   f) a transducer disposed at said first end for generating and propagating the surface acoustic wave through said channel from said first end to said second end for thereby transporting the electronic signal through said channel;
   g) a plurality of sensing electrodes operably associated with said channel and disposed along the propagation path of the surface acoustic wave for non-destructively sensing the electronic signal;
   h) an output circuit for processing the sensed electronic signal from said sensing electrodes;
   i) a plurality of active buffer circuits each having an input operably connected to respective sensing electrode and an output operably connected to said output circuit;
   j) said output circuit comprising a plurality of switches each connected to respective buffer circuit and a common output; and
   k) said switches are operable such that only one of said switches is in the open position at any one time.

* * * * *